United States Patent
Dieguez

(12) 
(10) Patent No.: US 7,127,022 B1
(45) Date of Patent: Oct. 24, 2006

(54) CLOCK AND DATA RECOVERY CIRCUITS UTILIZING DIGITAL DELAY LINES AND DIGITALLY CONTROLLED OSCILLATORS

(75) Inventor: Leonard W. Dieguez, San Diego, CA (US)

(73) Assignee: Xilinx, Inc., San Jose, CA (US)

( * ) Notice: Subject to any disclaimer, the term of this patent is extended or adjusted under 35 U.S.C. 154(b) by 763 days.

(21) Appl. No.: 10/394,350

(22) Filed: Mar. 21, 2003

(51) Int. Cl.
*H04L 25/40* (2006.01)

(52) U.S. Cl. .................. 375/375; 375/376; 327/155; 327/158; 327/159; 327/161

(58) Field of Classification Search ................ 375/371, 375/373, 375, 376; 327/155, 156, 158, 159, 327/161
See application file for complete search history.

(56) References Cited

U.S. PATENT DOCUMENTS 6,348,823 B1 * 2/2002 Pan ............................. 327/159
6,686,784 B1 * 2/2004 Chang ........................ 327/157

* cited by examiner

*Primary Examiner*—Dac V. Ha
(74) *Attorney, Agent, or Firm*—Lois D. Cartier

(57) ABSTRACT

Clock and data recovery (CDR) circuits that are fully digital. A data stream encoded with clocking information is passed through a tapped digital delay line. A phase and frequency detector coupled to the registered outputs of the tapped digital delay line determines the phase and frequency relationship between the recovered clock (DCO clock) and the transmit clock. A filter and control circuit then uses this information to generate a "servo" control signal, which is passed through a dither circuit and fed back to a digitally controlled oscillator (DCO). The circuit adjusts the DCO clock signal to match the transmit clock based on the value of this control signal.

20 Claims, 4 Drawing Sheets

US 7,127,022 B1

CLOCK AND DATA RECOVERY CIRCUITS UTILIZING DIGITAL DELAY LINES AND DIGITALLY CONTROLLED OSCILLATORS

FIELD OF THE INVENTION

The invention relates to clock and data recovery circuits. More particularly, the invention relates to clock and data recovery circuits utilizing digital delay lines and digitally controlled oscillators (DCOs).

BACKGROUND OF THE INVENTION

Serial data streams are frequently utilized in communication between and within electronic systems. A serial data stream often includes both digitized data and a clock signal (the "transmit clock"), combined to form a single, easily transmitted stream of data bits. At the destination, the data is extracted from the data stream. However, the transmit clock is also extracted from the data stream, and is used to operate at least a portion of the destination system or device. The circuit that performs this clock and data recovery is called a "clock and data recovery circuit", or a CDR circuit.

The clock recovery process includes determining both the frequency of the transmit clock, and the phase of the transmit clock relative to a reference clock signal. Most CDR circuits use analog techniques to perform the phase and frequency detection, and these analog techniques require that signals be integrated. Design and integration of this CDR circuitry can be a time-consuming process requiring much fine-tuning and extensive circuitry.

Therefore, it is desirable to find simpler circuits for performing clock and data recovery, preferably not involving analog circuitry.

SUMMARY OF THE INVENTION

The invention provides clock and data recovery (CDR) circuits that are fully digital. A data stream encoded with clocking information is passed through a tapped digital delay line. A phase and frequency detector coupled to the registered outputs of the tapped digital delay line determines the phase and frequency relationship between the recovered clock (DCO clock) and the transmit clock. A filter and control circuit then uses this information to generate a "servo" control signal, which is passed through a dither circuit and fed back to a digitally controlled oscillator (DCO). The circuit adjusts the DCO clock signal to match the transmit clock based on the value of this control signal.

According to some embodiments of the invention, a CDR circuit includes a serial data input terminal; a delay line phase and frequency detector; a filter and control circuit; a dither circuit; and a DCO. The serial data input terminal provides a data stream that includes an encoded transmit clock signal. The delay line phase and frequency detector has a first input terminal coupled to the serial data input terminal, a DCO clock input terminal, and a plurality of output terminals. The filter and control circuit has a plurality of input terminals coupled to the output terminals of the delay line phase and frequency detector, and also has an output terminal. The dither circuit has an input terminal coupled to the output terminal of the filter and control circuit, and an output terminal. The DCO has an input terminal coupled to the output terminal of the dither circuit, and an output terminal coupled to the DCO clock input terminal of the delay line phase and frequency detector.

In some embodiments of the invention, the delay line phase and frequency detector includes a delay line, a register, and a phase and frequency detector. The delay line has an input terminal coupled to the serial data input terminal, and a plurality of tap output terminals comprising a series of taps from the delay line. The register has a plurality of data input terminals coupled to the tap output terminals of the delay line, a clock terminal coupled to the DCO clock input terminal of the delay line phase and frequency detector, and a plurality of data output terminals. The phase and frequency detector has a plurality of input terminals coupled to the data output terminals of the register, a DCO clock input terminal coupled to the DCO clock input terminal of the delay line phase and frequency detector, and a plurality of output terminals coupled to the output terminals of the delay line phase and frequency detector.

In some embodiments, the register includes two flip-flops coupled in series between each data input terminal and data output terminal. Each flip-flop has a clock input terminal coupled to the DCO clock input terminal of the delay line phase and frequency detector. In some embodiments, the register further includes a data output flip-flop having a clock input terminal coupled through an inverter to the DCO clock input terminal of the delay line phase and frequency detector. The data output flip-flop provides data extracted from the center of the delay line.

In some embodiments, there are 64 tap output terminals on the delay line, and the register has 64 data output terminals. In other embodiments, other numbers of taps are included.

In some embodiments, the CDR circuit is implemented in a programmable logic device (PLD). In some embodiments, the PLD includes a plurality of programmable digital resources, and the delay line phase and frequency detector, the filter and control circuit, the dither circuit, and the DCO are all implemented using the programmable digital resources. In some embodiments, the PLD is a Field Programmable Gate Array (FGPA). The delay line can be implemented, for example, using a carry chain of the FPGA.

In some embodiments, the data stream comprises 8 B/10 B encoded data in an NRZ format.

According to other embodiments of the invention, a system includes two devices (e.g., integrated circuits or PC boards). A first device has a serial data output terminal that provides a data stream including an encoded transmit clock signal. A second device has a serial data input terminal coupled to the serial data output terminal of the first device. The second device also includes a serial data input terminal; a delay line phase and frequency detector; a filter and control circuit; a dither circuit; and a digitally controlled oscillator (DCO). These circuit elements are coupled together substantially as described above.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
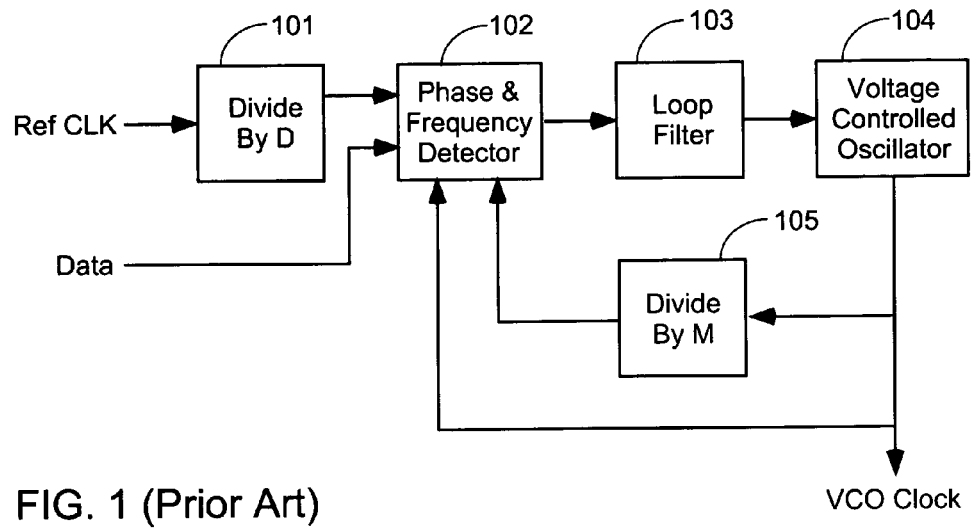
FIG. 1 is a block diagram of a prior art clock and data recovery (CDR) circuit.

FIG. 1 is a block diagram of a prior art clock and data recovery (CDR) circuit. This type of circuit is well known, as are the components included therein. The circuit includes a first divider circuit 101, a phase and frequency detector 102, a loop filter 103, a voltage controlled oscillator (VCO) 104, and a second divider circuit 105.

Divider circuit 101 divides the frequency of an input reference clock by a factor of "D". The divided clock signal is provided to phase and frequency detector 102, which compares the phase of the divided clock with a "VCO Clock" output signal generated by the VCO.

Phase and frequency detector 102 typically includes two phase and frequency detectors (PFDs). A first PFD (not shown) compares the phase and frequency of the VCO clock to the reference clock ("Ref CLK" in FIG. 1.). Once the VCO clock is locked to the reference clock signal the data input rate and the VCO clock rate should be within a small known difference, e.g., within 100 ppm (parts per million) of each other. Digital logic is used to determine when the VCO clock is locked to the reference clock signal and when data is present. If both conditions are met, then the second PFD is enabled. The second PFD further adjusts the VCO to phase and frequency lock the VCO clock at the data rate.

An output signal from phase and frequency detector 102 is filtered using loop filter 103 and provided to VCO 104. The VCO output clock signal provides the extracted clock signal VCO Clock, which is also divided in divider circuit 105 and used to control the phase and frequency detector 102.

The voltage controlled oscillator is an analog circuit. It typically requires re-engineering for every process change, and can take more area to implement than a corresponding digital circuit.

Figure 2:
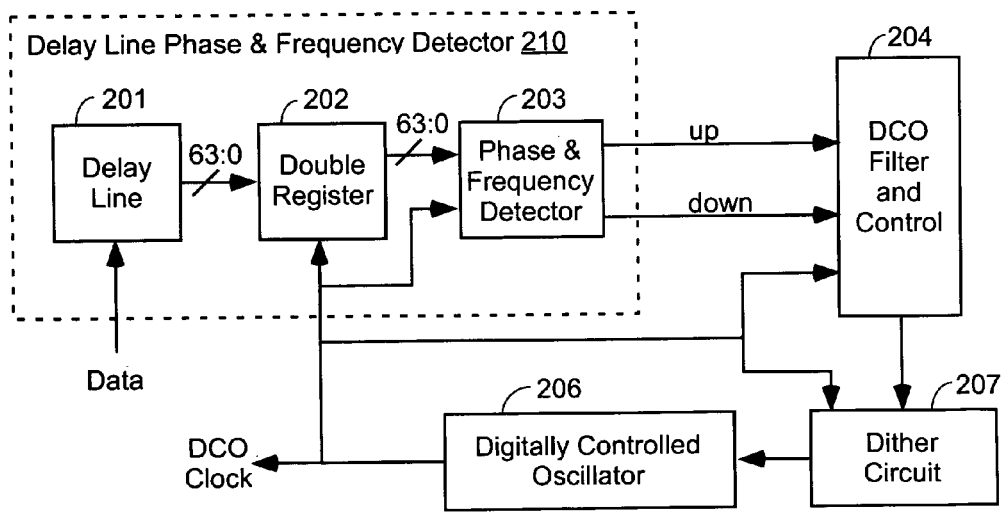
FIG. 2 is a block diagram of a CDR circuit according to an embodiment of the present invention.

FIG. 2 is a block diagram of a CDR circuit according to an embodiment of the present invention. The CDR circuit of FIG. 2 includes only digital components. Therefore, the entire circuit can be implemented in a PLD, such as a Field Programmable Gate Array (FPGA). One FPGA in which the circuit can be implemented is the Virtex™-II FPGA available from Xilinx, Inc.

The clock and data recovery circuit of FIG. 2 includes a delay line phase and frequency detector 210, a DCO filter and control circuit 204, a dither circuit 207, and a digitally controlled oscillator (DCO) 206. The DCO provides a DCO clock signal, which in this embodiment is the "receive clock" described above. The DCO clock signal is provided to delay line phase and frequency detector 210, DCO filter and control circuit 204, and dither circuit 207.

Figure 6:
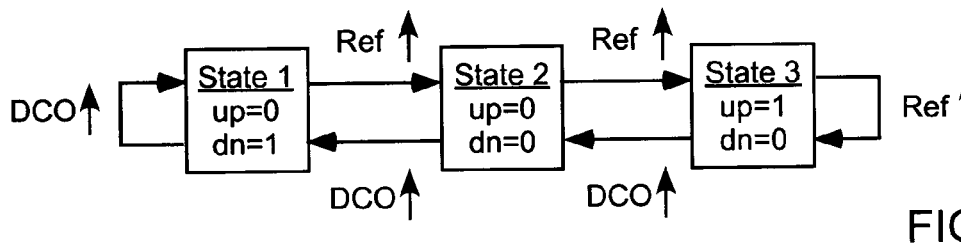
FIG. 6 is a state diagram of a 3-state phase and frequency detector that can be used in the embodiment of FIG. 2.
Figure 7:
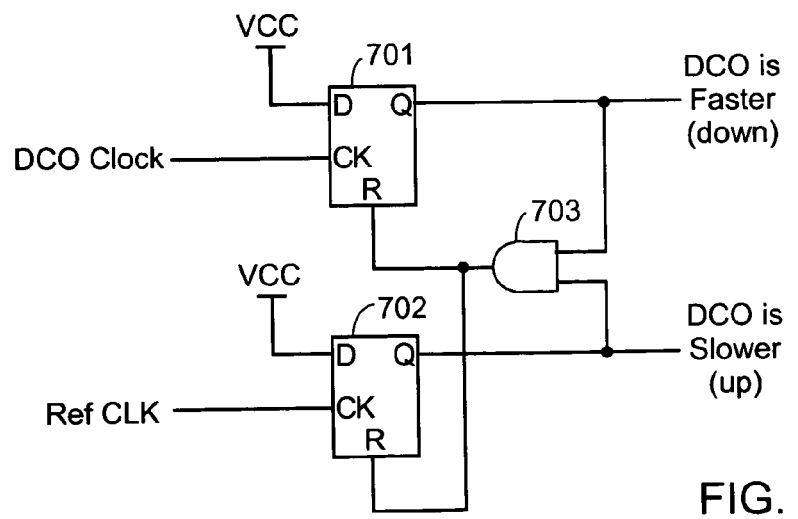
FIG. 7 is a schematic illustrating one embodiment of the 3-state phase frequency detector of FIG. 6.

The clock and data recovery circuit of FIG. 2 can be used as follows, for example. First, the DCO clock signal is locked to the approximate bit rate as defined by the reference clock. This step can be performed using a simple PFD, as described above in connection with FIG. 1. (FIGS. 6 and 7 show a simple PFD that can be used to perform this "lock to reference" function.) Second, logic circuitry switches the DCO correction values to the inputs of the delay line phase and frequency detector 210 shown in FIG. 2. The delay line phase and frequency detector 210, in conjunction with DCO filter and control circuit 204 and dither circuit 207, further adjusts the DCO to match the exact frequency of the received data rate.

Delay line phase and frequency detector 210 includes a delay line 201, a double register 202, and a phase and frequency detector 203. Briefly, the delay line phase and frequency detector 210 passes the incoming data stream through a delay line, then samples the delayed values using the DCO clock signal. The resulting samples are compared against adjacent samples to create edge signals. The edge signals represent phase differences between the current phase and the desired phase between the DCO and the received data. Successive edge samples are stored and compared to extract a frequency relationship between the received data and the DCO. Phase and frequency detector 210 then generates two signals "up" and "down" indicating whether the DCO clock signal edge needs to be moved earlier or delayed relative to the received data stream.

Figure 3:
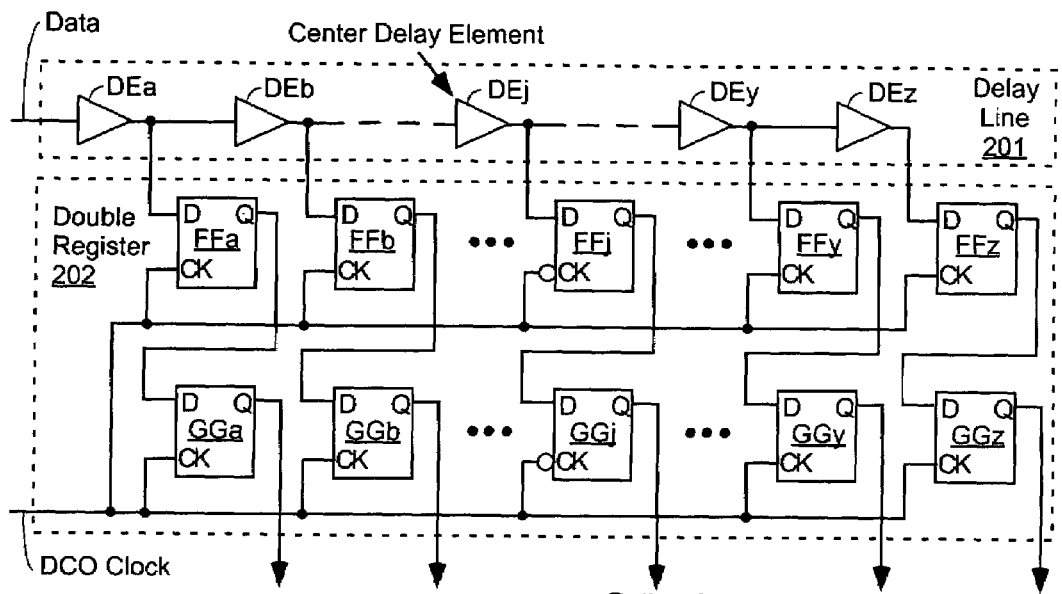
FIG. 3 is a schematic diagram illustrating exemplary embodiments of the delay line and register of FIG. 2.

FIG. 3 illustrates one implementation of delay line 201 and double register 202. The incoming data stream ("Data") drives delay line 201, which includes a series of delay elements DEa–DEz. Delay elements DEa–DEz can be, for example, inverters or pairs of inverters. When implemented in a Virtex-II FPGA, the carry multiplexer chain can be used to provide the chain of delay elements.

The number of delay elements can be any number. In one embodiment, 64 delay elements are included. Each delay element DEa–DEz is tapped to provide an output signal. Each successive output signal is delayed by one additional unit delay from the input data signal. The complete delay line preferably has a delay of greater than one DCO clock period, but less than two DCO clock periods.

Each tap output from delay line 201 drives the data input terminal D of a corresponding flip-flop FFa–FFz, included in double register 202. The registered output signal Q of each flip-flop FFa–FFz in turn drives the data input terminal D of another corresponding flip-flop GGa–GGz. In one embodiment, there are 64 flip-flops FFa–FFz and 64 flip-flops GGa–GGz. The flip-flops are clocked by the DCO output clock signal. Thus, the two flip-flops coupled in series for each delay line data tap serve to align the tapped data with the DCO clock signal and to remove any metastability that might otherwise be present.

Note that in the pictured embodiment one tap at the center of the delay line (DEj, the "Center Delay Element") is clocked by the inverse of the DCO clock signal. This tap provides the data extracted from the incoming data stream. The use of the inverse clock signal to clock this tap ensures that the sampling of the data is 180 degrees out of phase with any jitter that might be present on the data signal.

Figure 4:
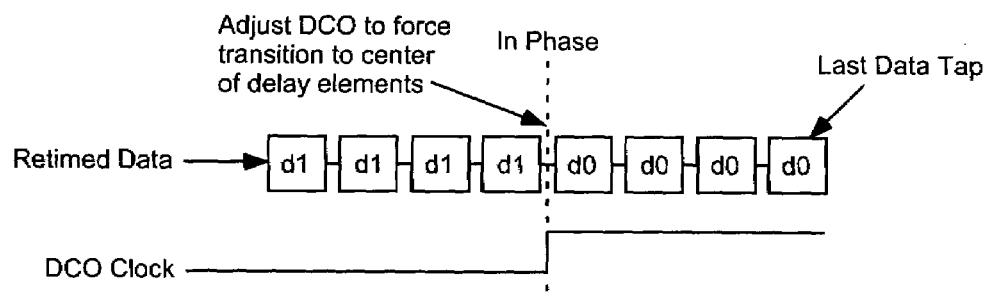
FIG. 4 is a diagram illustrating the phase adjustment process for the embodiment of FIG. 2.

Returning now to FIG. 2, phase and frequency detector 203 evaluates the phase and the frequency of the DCO clock signal relative to that of the transmit clock signal embedded in the data stream, and provides related status signals to the DCO filter and control circuit. FIG. 4 illustrates the phase adjustment process for clock recovery using, for example, the CDR circuit of FIG. 2. In one embodiment, the data stream is 8 B/10 B encoded data in an NRZ format. Therefore, there may be several bit times with no transitions. With 8 B/10 B encoded data, the maximum number of bit times without transitions (the maximum run length) is limited to five. The data stream is described as a reference clock with missing transitions (a punched clock). A data stream that transitions only once during a bit time is a single data rate (SDR) signal. This makes the data stream appear as a half-rate clock when an alternating one/zero pattern is present.

FIG. 4 illustrates the sampled data from double register 202. The data typically includes many more than eight values, but only eight values are shown to simplify the drawing. FIG. 4 illustrates a data string that includes four "zero" data values (d0) followed by four "one" data values (d1). The object of the delay line phase and frequency detector 210 is to perform the following functions: to detect if a data transition occurred within the current sample period (e.g., the eight samples shown in FIG. 4); to detect if multiple transitions occurred within the current sample period; to provide a phase and/or frequency error output signal (e.g., "up" and "down"); and to provide the retimed data output signal. The up and down signals provided by the phase and frequency detector enable the DCO filter and control circuit to adjust the DCO output clock signal, causing the DCO to align the data transition to the center of the delay line, as shown in FIG. 4.

To detect if one or more data transitions occurred within the current sample period, various strategically spaced sample points on the delay line are compared. The sample points should be close enough to the adjacent sample point to guarantee that two transitions cannot occur undetected. For example, on a delay line with 64 taps, sample points 0, 15, 31, 47, and 63 can be used. For sample time periods with no data transitions, the sample points are all equal. For sample time periods with one data transition, only one difference between adjacent sample points is detected. For sample time periods with two or more data transitions, more than one difference between adjacent sample points is detected. A clock enable signal is constructed from the comparison of the sample points, which is set to an enabling value only when one or more valid transitions occurred during the sample period.

The delay line phase and frequency detector is preferably designed for a maximum of two data transitions in the delay line. A filtering mechanism is employed that allows the use of only one of the data transitions for phase error calculations. For example, if two data transitions are detected (e.g., one at the beginning and one at the end of the delay line), a phase correction is input to the DCO such that the phase of one transition is forced to the center of the delay line. Which transition is selected depends on the last known phase, i.e., whether the DCO is running a faster or slower frequency than the nominal bit rate frequency.

Figure 5:
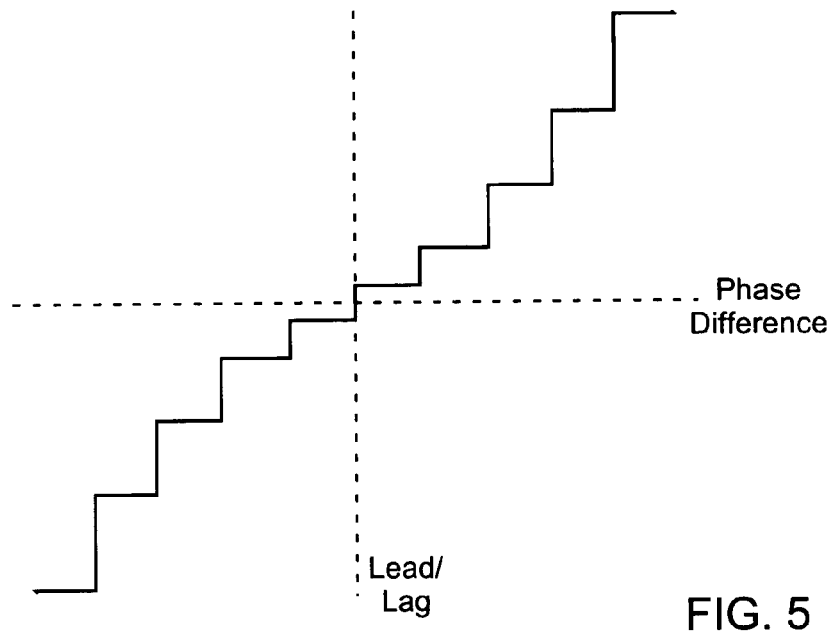
FIG. 5 is a diagram illustrating the degree of phase adjustment in the circuit of FIG. 2.

The up and down output signals from phase and frequency detector 203 are decoded in DCO filter and control circuit 204 to indicate the relative number of delay elements from the center of the delay line. For example, the up signal can be an encoded signal in which the frequency of high pulses indicates how far the signal lags the center of the delay line. Phase errors close to the center of the tapped delay line indicate small phase errors, therefore, smaller corrections are needed. Phase errors further from the center of the taped delay line indicate that larger corrections are needed. FIG. 5 shows an exemplary relationship between the distance from the center of the delay line (the horizontal axis) and the size of the required correction (the vertical axis).

The retimed data output signal is provided by a tap centrally located in the delay line, as shown in FIG. 3 and described in reference to that figure.

FIG. 6 is a state diagram of a 3-state phase and frequency detector that can be used to perform the "lock to reference" function in the CDR circuit of FIG. 2, as described above in connection with FIG. 2. State 2 is the initial state (both "up" and "down" are low). A rising edge on the reference signal causes "up" to be asserted, forcing a transition to State 3. A transition to State 3 indicates that the DCO clock signal is too slow and needs to be speeded up in frequency. From State 3, when a rising edge of the DCO clock signal occurs, the circuit returns to State 2. From State 2, when a rising edge of the DCO clock signal occurs, the circuit changes to State 1. A transition to State 1 indicates that the DCO clock signal is too fast and needs to be lowered in frequency. The maximum useful frequency for the circuit is limited by the minimum duration of State 2.

The state where both "up" and "down" are high occurs only briefly, if at all. For example, FIG. 7 shows one implementation of the state machine shown in FIG. 6. This circuit includes two flip-flops 701, 702 and an AND-gate 703. Both "up" and "down" are briefly high when transitioning from State 3 to State 2.

When the DCO clock signal is running at a faster frequency or is leading the reference signal in phase, the DCO clock signal needs to be slowed down or delayed. Thus, the signal "down", or "DCO is Faster" is asserted. When the DCO clock signal is running at a slower frequency or is trailing the reference signal in phase, the DCO clock signal needs to be speeded up or moved earlier. Thus, the signal "up", or "DCO is Slower" is asserted.

Other phase and frequency detector circuits can also be used, including circuits that generate encoded status signals to be provided to the DCO filter and control circuit. For example, four separate signals can be provided: a "Clock Leads" signal indicating that the DCO clock edge leads the transmit clock edge; a "Clock Lags" signal indicating that the DCO clock edge lags behind the transmit clock edge; a "Clock is Fast" signal indicating that the frequency of the DCO clock is faster than the frequency of the transmit clock; and a "Clock is Slow" signal indicating that the frequency of the DCO clock is slower than the frequency of the transmit clock. In some embodiments, these signals include encoded information about the magnitude of the difference between the two clock signals, as previously described with reference to FIG. 5.

Following is HDL code for one embodiment of phase and frequency detector 203 that can be used in accordance with the invention.

```
/////////////////////////////////////////////
// register the delayed data (taps)
always @ (posedge clk or posedge reset ) begin
    if (reset) begin
        pd_2R        <= #1 32'b0 ;
        phase        <= #1 16'b0 ;
        phase_en     <= #1 1'b0 ;
        phaseR       <= #1 16'b0 ;
        phase2R      <= #1 16'b0 ;
        phase3R      <= #1 16'b0 ;
    end
    else  begin
        pd_2R             <= #1 data_taps;
        // detect a transition during this period.
        phase_en     <= #1        pd_2R[31] & ~pd_2R[0] ;
        // detect the rising edge
        // as it travels up the delay chain
        phase[0]     <= #1        pd_2R[2] & ~pd_2R[0] ;
        phase[1]     <= #1        pd_2R[4] & ~pd_2R[2] ;
        phase[2]     <= #1        pd_2R[6] & ~pd_2R[4] ;
```

```
            phase[3]      <= #1   pd__2R[8]  & ~pd__2R[6] ;
            phase[4]      <= #1   pd__2R[10] & ~pd__2R[8] ;
            phase[5]      <= #1   pd__2R[10] & ~pd__2R[10] ;
            phase[6]      <= #1   pd__2R[14] & ~pd__2R[12] ;
            phase[7]      <= #1   pd__2R[16] & ~pd__2R[14] ;
            // center
            phase[8]      <= #1   pd__2R[17] & ~pd__2R[16] ;
            phase[9]      <= #1   pd__9R[19] & ~pd__2R[17] ;
            phase[10]     <= #1   pd__2R[21] & ~pd__2R[19] ;
            phase[11]     <= #1   pd__2R[23] & ~pd__2R[21] ;
            phase[12]     <= #1   pd__2R[25] & ~pd__2R[23] ;
            phase[13]     <= #1   pd__2R[27] & ~pd__2R[25] ;
            phase[14]     <= #1   pd__2R[29] & ~pd__2R[27] ;
            phase[15]     <= #1   pd__2R[31] & ~pd__2R[29] ;
            // only update when a valid phase hit occurs
            if (phase_en) begin
                phaseR        <= #1 phase;
            end
            //store phaseR for two clocks
            if(pd_enable[0]) begin
                phase2R       <= #1 phaseR;
                phase3R       <= #1 phase2R;
            end
        end
end
//////////////////////////////////////////////////
reg   [14:0]     clkisfast ;
reg   [14:0]     clkisslow ;
reg              clkisfast_en ;
reg              clkisslow_en ;
reg              clkisfast_enR ;
reg              clkisslow_enR ;
//////////////////////////////////////////////////
// frequency detection
always @ (posedge clk or posedge reset ) begin
    if (reset) begin
        clkisslow         <= #1 15'b0;
        clkisfast         <= #1 15'b0;
        clkisfast_en      <= #1 1'b0 ;
        clkisslow_en      <= #1 1'b0 ;
        clkisfast_enR     <= #1 1'b0 ;
        clkisslow_enR     <= #1 1'b0 ;
    end
    else if (pd_enable[0]) begin
        // clock is fast
        clkisfast[14]     <= #1 (phase2R[14] & phase3R[15] );
        clkisfast[13]     <= #1 (phase2R[13] & phase3R[14] ) |
                                (phase2R[13] & phase3R[15] );
        clkisfast[12]     <= #1 (phase2R[12] & phase3R[13] ) |
                                (phase2R[12] & phase3R[14] ) |
                                (phase2R[12] & phase3R[15] );
        clkisfast[11]     <= #1 (phase2R[11] & phase3R[12] ) |
                                (phase2R[11] & phase3R[13] ) |
                                (phase2R[11] & phase3R[14] );
        clkisfast[10]     <= #1 (phase2R[10] & phase3R[11] ) |
                                (phase2R[10] & phase3R[12] ) |
                                (phase2R[10] & phase3R[13] );
        clkisfast[9]      <= #1 (phase2R[9]  & phase3R[10] ) |
                                (phase2R[9]  & phase3R[11] ) |
                                (phase2R[9]  & phase3R[12] );
        clkisfast[8]      <= #1 (phase2R[8]  & phase3R[9]  ) |
                                (phase2R[8]  & phase3R[10] ) |
                                (phase2R[8]  & phase3R[11] );
        clkisfast[7]      <= #1 (phase2R[7]  & phase3R[8]  ) |
                                (phase2R[7]  & phase3R[9]  ) |
                                (phase2R[7]  & phase3R[10]);
        clkisfast[6]      <= #1 (phase2R[6]  & phase3R[7]  ) |
                                (phase2R[6]  & phase3R[8]  ) |
                                (phase2R[6]  & phase3R[9]  );
        clkisfast[5]      <= #1 (phase2R[5]  & phase3R[6]  ) |
                                (phase2R[5]  & phase3R[7]  ) |
                                (phase2R[5]  & phase3R[8]  );
        clkisfast[4]      <= #1 (phase2R[14] & phase3R[5]  ) |
                                (phase2R[4]  & phase3R[6]  ) |
                                (phase2R[4]  & phase3R[7]  );
        clkisfast[3]      <= #1 (phase2R[3]  & phase3R[4]  ) |
                                (phase2R[3]  & phase3R[5]  ) |
                                (phase2R[3]  & phase3R[6]  );
        clkisfast[2]      <= #1 (phase2R[2]  & phase3R[3]  ) |
                                (phase2R[2]  & phase3R[4]  ) |
                                (phase2R[2]  & phase3R[5]  );
        clkisfast[1]      <= #1 (phase2R[1]  & phase3R[2]  ) |
                                (phase2R[1]  & phase3R[3]  ) |
                                (phase2R[1]  & phase3R[4]  );
        clkisfast[0]      <= #1 (phase2R[0]  & phase3R[1]  ) |
                                (phase2R[0]  & phase3R[2]  ) |
                                (phase2R[0]  & phase3R[3]  );
        // clock is slow
        clkisslow[0]      <= #1 (phase2R[15] & phase3R[14]) |
                                (phase2R[15] & phase3R[13] ) |
                                (phase2R[15] & phase3R[12]);
        clkisslow[1]      <= #1 (phase2R[14] & phase3R[13]) |
                                (phase2R[14] & phase3R[12] ) |
                                (phase2R[14] & phase3R[11]);
        clkisslow[2]      <=#1  (phase2R[13] & phase3R[12]) |
                                (phase2R[13] & phase3R[11] ) |
                                (phase2R[13] & phase3R[10]);
        clkisslow[3]      <= #1 (phase2R[12] & phase3R[11]) |
                                (phase2R[12] & phase3R[10] ) |
                                (phase2R[12] & phase3R[ 9]);
        clkisslow[4]      <= #1 (phase2R[11] & phase3R[10]) |
                                (phase2R[11] & phase3R[ 9] ) |
                                (phase2R[11] & phase3R[ 8]);
        clkisslow[5]      <= #1 (phase2R[10] & phase3R[9]) |
                                (phase2R[10] & phase3R[8]) |
                                (phase2R[10] & phase3R[7]);
        clkisslow[6]      <= #1 (phase2R[9]  & phase3R[8]) |
                                (phase2R[9]  & phase3R[7]) |
                                (phase2R[9]  & phase3R[6]);
        clkisslow[7]      <= #1 (phase2R[8]  & phase3R[7]) |
                                (phase2R[8]  & phase3R[6]) |
                                (phase2R[8]  & phase3R[5]);
        clkisslow[8]      <= #1 (phase2R[7]  & phase3R[6]) |
                                (phase2R[7]  & phase3R[5]) |
                                (phase2R[7]  & phase3R[4]);
        clkisslow[9]      <= #1 (phase2R[6]  & phase3R[5]) |
                                (phase2R[6]  & phase3R[4]) |
                                (phase2R[6]  & phase3R[3]);
        clkisslow[10]     <= #1 (phase2R[5]  & phase3R[4]) |
                                (phase2R[5]  & phase3R[3]) |
                                (phase2R[5]  & phase3R[2]);
        clkisslow[11]     <= #1 (phase2R[4]  & phase3R[3]) |
                                (phase2R[4]  & phase3R[2]) |
                                (phase2R[4]  & phase3R[1]);
        clkisslow[12]     <= #1 (phase2R[3]  & phase3R[2]) |
                                (phase2R[3]  & phase3R[1]) |
                                (phase2R[3]  & phase3R[0]);
        clkisslow[13]     <= #1 (phase2R[2]  & phase3R[1]) |
                                (phase2R[2]  & phase3R[0]);
        clkisslow[14]     <= #1 (phase2R[1]  & phase3R[0]);
//////////////////////////////////////////////////
        clkisfast_en      <= #1         |clkisfast[14:0] ;
        clkisslow_en      <= #1         |Clkisslow[14:0] ;
        clkisfast_enR     <= #1         clkisfast_en ;
        clkisslow_enR     <= #1         clkisslow_en ;
    end
end
//////////////////////////////////////////////////
reg   [4:0]      cisfastcnt ;
reg   [4:0]      cisslowcnt ;
wire             cisfast_tc ;
wire             cisslow_tc ;
//////////////////////////////////////////////////
// Clock-is-fast or -slow counters.
// This is the frequency detection filter.
// It acts as an integrator for the frequency differences.
// In the ideal case, when both the data and the oscillator
// are frequency locked but not phase locked, this counter
// should not have an output or be counting. However,
// because of systematic issues like jitter, the counter
// does count due to small phase changes.
//////////////////////////////////////////////////
always @ (posedge clk or posedge reset ) begin
    if (reset) begin
        cisfastcnt        <= #1 0 ;
        cisslowcnt        <= #1 0 ;
        cisfast_tcR       <= #1 1'b0 ;
```

```
                cisslow_tcR         <= #1 1'b0 ;
            end
        else if ( pd_enable[0] ) begin
                                // enable the counter every 4 clocks
////////////////////////////////////////////
            if (cisfast_tc )                // use the msb as the sync
                cisfastcnt          <= #1 0 ;
            else if (clkisfast_en )
                cisfastcnt          <= #1 cisfastcnt + 1 ;
////////////////////////////////////////////
            if (cisslowtc )                 // use the msb as the sync
                cisslowcnt          <= #1 0 ;
            else if (clkisslow_en )
                cisslowcnt          <= #1 cisslowcnt + 1 ;
        end
end
assign cisfast_tc = cisfastcnt[4] ;
                                // assign the terminal counts
assign cisslow_tc = cisslowcnt[4] ;
////////////////////////////////////////////
reg         clklags ;
reg         clkleads ;
reg  [6:0]  clkleadscnt ;
reg  [6:0]  clklagscnt ;
reg         clkleads_tcR ;
reg         clklags_tcR ;
reg         leadlagcnt_en ;
wire        mkclkfaster;
wire        mkclkslower;
////////////////////////////////////////////
// phaseR 8 to 15 clk lags
// phaseR 0 to 7  clk leads
//
// Section to correct phase errors but not frequency error.
//
// Clock leads or lags counters.
// This is the phase detection filter.
// It acts as an integrator for the phase differences.
// In the ideal case, when both the data and the oscillator
// are frequency locked but not phase locked, this counter
// outputs corrections for the phase error.
////////////////////////////////////////////
always @ (posedge clk or posedge reset ) begin
    if (reset) begin
        clklags             <= #1 0 ;
        clkleads            <= #1 0 ;
        clkleadscnt         <= #1 0 ;
        clklagscnt          <= #1 0 ;
    end
    else if ( pd_enable[0] ) begin
                                // enable the counter every 4 clocks
        clkleads    <= #1 | phase2R[7:0] ;
        clklags     <= #1 | phase2R[15:8] ;
        //lead lag counters
        if (clkleads_tc)                // use the msb as the sync
                                        // reset for both counters
            clkleadscnt         <= #1 0 ;
        else if (phase2R[0])
            clkleadscnt         <= #1 clkleadscnt + 8 ;
        else if (phase2R[1])
            clkleadscnt         <= #1 clkleadscnt + 7 ;
        else if (phase2R[2])
            clkleadscnt         <= #1 clkleadscnt + 6 ;
        else if (phase2R[3])
            clkleadscnt         <= #1 clkleadscnt + 6 ;
        else if (phase2R[4])
            clkleadscnt         <= #1 clkleadscnt + 4 ;
        else if (phase2R[5])
            clkleadscnt         <= #1 clkleadscnt + 3 ;
        else if (phase2R[6])
            clkleadscnt         <= #1 clkleadscnt + 2 ;
        else if (phase2R[7])
            clkleadscnt         <= #1 clkleadscnt + 1 ;
////////////////////////////////////////////
        if (clklags_tc)                 // use the msb as the sync
                                        // reset for both counters
            clklagscnt          <= #1 0 ;
        else if (phase2R[8])
            clklagscnt          <= #1 clklagscnt + 1 ;
        else if (phase2R[9])
            clklagscnt          <= #1 clklagscnt + 2 ;
        else if (phase2R[10])
            clklagscnt          <= #1 clklagscnt + 3 ;
        else if (phase2R[11])
            clklagscnt          <= #1 clklagscnt + 4 ;
        else if (phase2R[12])
            clklagscnt          <= #1 clklagscnt + 5 ;
        else if (phase2R[13])
            clklagscnt          <= #1 clklagscnt + 6 ;
        else if (phase2R[14])
            clklagscnt          <= #1 clklagscnt + 7 ;
        else if (phase2R[15])
            clklagscnt          <= #1 clklagscnt + 8 ;
    end
end
assign clkleads_tc  = clkleadscnt[6] ;
                                //assign the terminal counts
assign clklags_tc   = clklagscnt[6] ;
assign mkclkfaster  = cisslow_tc | clklags_tc ;    // up signal
assign mkclkslower  = cisfast_tc | clkleads_tc ;
                                // down signal
////////////////////////////////////////////
```

Returning now to FIG. 2, DCO filter and control circuit 204 receives the error signals (e.g., up and down) provided by delay line phase and frequency detector 210, and provides a control output signal to dither circuit 207. In some embodiments, DCO filter and control circuit 204 includes a loop filter that smoothes out the phase error signal input data. The loop filter provides a meaningful correction in the presence of random and deterministic jitter on the data. It compares the number of phase lead errors to the number of phase lag errors per update period.

For example, if the update period is ten clock cycles and there are an equal number of phase leads errors and phase lag errors, then no correction need be made. If there are unequal numbers of lead and lag errors, then a DCO correction is made. The magnitude of the correction depends on the magnitude of the phase error signal.

Returning again FIG. 2, note that dither circuit 207 is inserted between DCO filter and control circuit 204 and the DCO 206. Dither circuits are well known in the relevant arts. Dither circuit 207 simply allows the DCO to be toggled between two discrete taps of the DCO. The toggling has the effect of giving the DCO more resolution between update periods. One drawback of using a DCO for clock and data recovery is that the discrete nature of the DCO enables large phase errors to build up during times with no phase updates from data transitions. For example, if the update rate is ten clock cycles and the DCO is off in frequency by 40 picoseconds (ps), then on the next update the total phase error could be off by 400 ps. By including dithering of the period of the DCO, the error can be reduced on a per update rate, effectively lowering the period error to a maximum of one delay element. Having intermediate step sizes spreads the error over the update rate. The update rate is related to the maximum run length and the pipeline delay of the phase and frequency detector.

For example, if the DCO is being updated at a rate of once every ten clock cycles and there are ten dither values for the update rate, a tap/trim element can be added to the total delay for a fraction of the clock of the update rate period. Rather than having a correction of a full tap/trim for the entire rate period, the correction is in effect for only a few clock cycles, and then is removed. The effect is to produce a finer resolution than that of static values for an entire update period.

Following is HDL code for one embodiment of dither circuit 207 that can be used in accordance with the invention.

```
//////////////////////////////////////////////////
module oscadjust_v00 (
        clk,
        reset,
        clkisfast,
        clkisslow,
        clkleads,
        clklags,
        dcm_done,
        statusaddr,
        ctlgo,
        ctlsel_2,
        dco_rst
        );
input           clk;
input           reset;
input           clkisfast;
input           clkisslow;
input           clkleads;
input           clklags;
input           dcm_done;
output  [3:0]   statusaddr ;
output          ctlgo ;
output          ctlsel_2 ;
output          dco_rst ;
//////////////////////////////////////////////////
// local signals
reg     [2:0]   dvalue_count ;
reg     [3:0]   dvalue_cnt_en ;
reg     [1:0]   dco_update
reg     [3:0]   dvalue ;
reg             dvalue_carry ;
reg             dvalue_borrw ;
reg             dvalue_incr ;
reg             dvalue_decr ;
wire    [15:0]  dither_update ;
reg     [15:0]  dither_updateR ;
//////////////////////////////////////////////////
always @ (posedge clk or posedge reset)
        if ( reset ) begin
                dvalue_cnt_en       <= #1 4'b0001 ;
                dvalue_count        <= #1 3'b000 ;
                dvalue              <= #1 4'b1000 ;
                dvalue_carry        <= #1 1'b0 ;
                dvalue_borrw        <= #1 1'b0 ;
                dvalue_incr         <= #1 1'b0 ;
                dvalue_decr         <= #1 1'b0 ;
                dither_updateR      <= #1 16'b0 ;
        end
        else begin
                dvalue_cnt_en       <= #1 { dvalue_cnt_en[2:0],
                                            dvalue_cnt_en[3] } ;
                if (    dvalue_cnt_en[0] )
                        dvalue_count        <= #1 dvalue_count + 1 ;
                // hold clkisfast hit until dvalue count rollover
                if ((   dvalue_count == 3'b111) & dvalue_cnt_en[0])
                        dvalue_incr         <= #1 1'b0 ;
                else if ( clkisfast )
                        dvalue_incr         <= #1 1'b1 ;
                // hold clkisslow hit until dvalue count rollover
                if ((   dvalue_count == 3'b111) & dvalue_cnt_en[0])
                        dvalue_decr         <= #1 1'b0 ;
                else if ( clkisslow )
                        dvalue_decr         <= #1 1'b1 ;
                if ((   dvalue_count == 3'b111) & dvalue_cnt_en[0])
                begin
                        // increment counter
                        if (    dvalue_incr & ~dvalue_decr)
                                if (    dvalue == 4'b1111 ) begin
                                        dvalue              <= #1 4'b1000 ;
                                        dvalue_carry        <= #1 1'b1;
                                end
                                else begin
                                        dvalue              <= #1 dvalue + 1 ;
                                end
```

```
                // decrement counter
            else if (      dvaluedecr & ~dvalue_incr)
                if (       dvalue 4'b0000 ) begin
                        dvalue              <= #1 4'b0111 ;
                        dvalue_borrw        <= #1 1'b1 ;
                end
                else begin
                        dvalue              <= #1 dvalue - 1 ;
                        dvalue_borrw        <= #1'b0 ;
                end
        end
        if ((dvalue_count == 3'b111) & dvalue_cnt_en[0])
        begin
                if ((  dvalue == 4'b1000 ) & dvalue_carry )
                begin
                        dither_updateR <= #1
                                {2'b01,dither_update[13:0]};
                        dvalue_carry        <= #1 1'b0 ;
                end
                else if ((dvalue 4'b0000) & (dvalue_decr))
                        dither_updater <= #1
                                {2'b10,dither_update[13:0]};
                else
                        dither_updater <= #1 dither_update ;
        end
    end
// lookup table for dither values
dither8_v00 dither8(
    .dvalue(dvalue),
    .update(dither_update)
);
always @ (posedge clk or posedge reset) begin
    if (reset)
        dco_update           <= #1 2'b00;
    else if ( dvalue_cnt_en[0] ) begin
        case (dvalue_count) /* synthesis parallel_case
synthesis full_case */
            3'b000 : dco_update <= dither_updateR[15:14] ;
            3'b001 : dco_update <= dither_updateR[13:12] ;
            3'b010 : dco_update <= dither_updateR[11:10] ;
            3'b011 : dco_update <= dither_updateR[ 9: 8] ;
            3'b100 : dco_update <= dither_updateR[ 7: 6] ;
            3'b101 : dco_update <= dither_updateR[ 5: 4] ;
            3'b110 : dco_update <= dither_updateR[ 3: 2] ;
            3'b111 : dco_update <= dither_updateR[ 1: 0] ;
        endcase
    end
end
dco_update_sm dco_update_sm(
    .reset (reset),
    .clk(clk),
    .done(dcm_done),
    .init_cnt_tc(dvalue_cnt_en[0]),
    .makefaster(dco_update[1]),
    .makeslower(dco_update[0]),
    //outputs
    .statusaddr(statusaddr),
    .ctlgo(ctlgo),
    .ctlsel_2(ctlsel_2),
    .dco_rst(dco_rst)
);
endmodule
////////////////////////////////////////////////////
module dither8_v00 ( dvalue, update );
input       [3:0]    dvalue ;       //dither value input
output      [15:0]   update ;
                 //dither update to be applied to the DCO
////////////////////////////////////////////////////
reg   [15:0] update ;
// There are 8 dither values. The outputs are represented in
// 2-bit form.
// Increments (+) makes the delay chain longer
//      (lowers the freq) and provides a "01" output.
// Decrements (-) makes the delay chain shorter
//      (raises the freq) and provides a "10" output.
// Both "00" and "11" outputs do not adjust the delay line.
////////////////////////////////////////////////////
always @ (dvalue) begin
    case (dvalue) /* synthesis parallel_case synthesis
```

-continued

```
full_case */
            //     1st    -> last adjustment
            //          + 0 0 0 0 0 0 -
    4'b1111 :   update <= 16'b01_00_00_00_00_00_00_10 ;
            //          + 0 0 - + 0 0 -
    4'b1110 :   update <= 16'b01_00_00_10_01_00_00_10 ;
            //          + 0 - + 0 - + -
    4'b1101 :   update <= 16'b01_00_10_01_00_10_01_10 ;
            //          + 0 - + - 0 + -
    4'b1100 :   update <= 16'b01_00_10_01_10_00_01_10 ;
            //          + - 0 + - 0 + -
    4'b1011 :   update <= 16'b01_10_00_01_10_00_01_10 ;
            //          + - 0 0 + - 0 0
    4'b1010 :   update <= 16'b01_10_00_00_01_10_00_00 ;
            //          + - 0 0 0 0 0 0
    4'b1001 :   update <= 16'b01_10_00_00_00_00_00_00 ;
            //          0 0 0 0 0 0 0 0
    4'b1000 :   update <= 16'b00_00_00_00_00_00_00_00 ;
            //          - + 0 0 0 0 0 0
    4'b0111 :   update <= 16'b10_01_00_00_00_00_00_00 ;
            //          - + 0 0 - + 0 0
    4'b0110 :   update <= 16'b10_01_00_00_10_01_00_00 ; //
            //          - + 0 - + 0 - +
    4'b0101 :   update <= 16'b10_01_00_10_01_00_10_01 ; //
            //          - 0 + - + 0 - +
    4'b0100 :   update <= 16'b10_00_01_10_01_00_10_01 ; //
            //          - 0 + - 0 + - +
    4'b0011 :   update <= 16'b10_00_01_10_00_01_10_01 ;
            //          - 0 0 + - 0 0 +
    4'b0010 :   update <= 16'b10_00_00_01_10_00_00_01 ;
            //          - 0 0 0 0 0 0 +
    4'b0001 :   update <= 16'b10_00_00_00_00_00_00_01 ;
            //          0 0 0 0 0 0 0 0
    4'b0000 :   update <= 16'b00_00_00_00_00_00_00_00 ;
    endcase
end
endmodule
```

Figure 8:
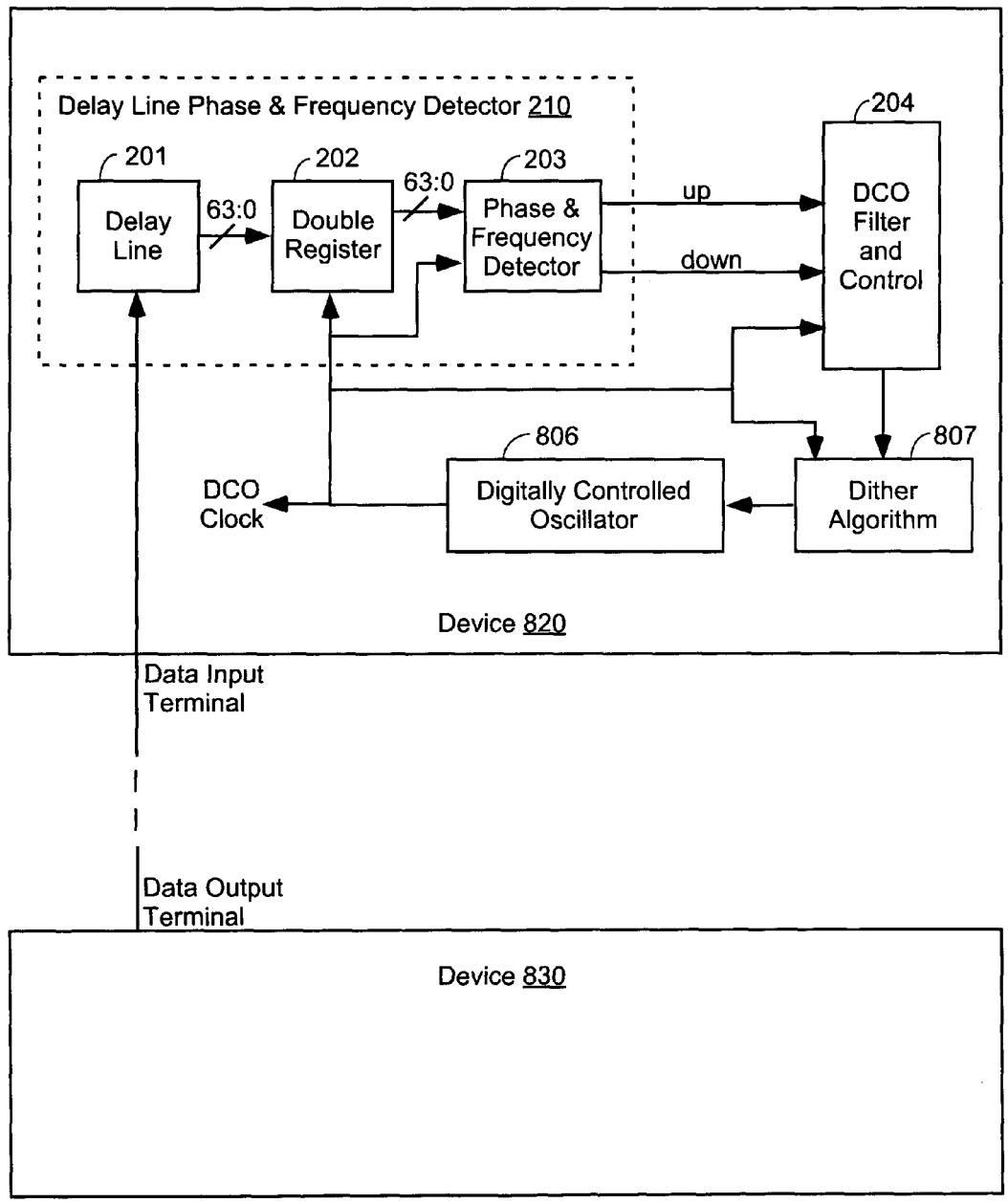
FIG. 8 shows a system in which the CDR circuit of FIG. 2 is used to facilitate communication between two devices in a system.

FIG. 8 shows a system in which the CDR circuit of FIG. 2 is used to facilitate communication between two devices in a system. The system includes two devices 820 and 830, in which device 830 provides encoded serial data to device 820. Device 830 has a serial data output terminal that provides a data stream including an encoded transmit clock signal. Device 820 has a serial data input terminal coupled to the serial data output terminal of device 830, and also includes the clock and data recovery circuit of FIG. 2.

Those having skill in the relevant arts of the invention will now perceive various modifications and additions that can be made as a result of the disclosure herein. For example, the above text describes the circuits of the invention in the context of integrated circuit (ICs) such as programmable logic devices (PLDs). However, the circuits of the invention can also be implemented in other electronic systems, for example, in printed circuit boards including discrete devices.

Further, data encoding formats, delay lines, delay elements, registers, flip-flops, frequency detectors, phase and frequency detectors, control circuits, DCOs, dither circuits, PLDs, FPGAs, oscillators, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance, the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A clock and date recovery (CDR) circuit, comprising:
a serial data input terminal providing a data stream that includes an encoded transmit clock signal;
a delay line phase and frequency detector having a first input terminal coupled to the serial data input terminal, a DCO clock input terminal, and a plurality of output terminals;
a filter and control circuit having a plurality of input terminals coupled to the plurality of output terminals of the delay line phase and frequency detector, a DCO clock input terminal, and an output terminal;
a dither circuit having an input terminal coupled to the output terminal of the filter and control circuit, a DCO clock input terminal, and an output terminal; and
a digitally controlled oscillator (DCO) having an input terminal coupled to the output terminal of the dither circuit, and further having an output terminal coupled to the DCO clock input terminal of the delay line phase and frequency detector, the DCO clock input terminal of the filter and control circuit, and the dither circuit.

2. The CDR circuit of claim 1, wherein the delay line phase and frequency detector comprises:
   a delay line having an input terminal coupled to the serial data input terminal, and further having a plurality of tap output terminals comprising a series of taps from the delay line;
   a register having a plurality of data input terminals coupled to the tap output terminals of the delay line, a clock terminal coupled to the DCO clock input terminal of the delay line phase and frequency detector, and a plurality of data output terminals; and
   a phase and frequency detector having a plurality of input terminals coupled to the data output terminals of the register, a DCO clock input terminal coupled to the DCO clock input terminal of the delay line phase and frequency detector, and a plurality of output terminals coupled to the plurality of output terminals of the delay line phase and frequency detector.

3. The CDR circuit of claim 2, wherein the register comprises two flip-flops coupled in series between each data input terminal and a corresponding data output terminal, each flip-flop having a clock input terminal coupled to the DCO clock input terminal of the delay line phase and frequency detector.

4. The CDR circuit of claim 3, wherein the register further comprises a data output flip-flop having a clock input terminal coupled through an inverter to the DCO clock input terminal of the delay line phase and frequency detector, the data output flip-flop providing data extracted from the center of the delay line.

5. The CDR circuit of claim 2, wherein:
   the plurality of tap output terminals of the delay line comprises 64 tap output terminals; and
   the plurality of data output terminals of the register comprises 64 data output terminals.

6. The CDR circuit of claim 1, wherein the CDR circuit is implemented in a programmable logic device (PLD).

7. The CDR circuit of claim 6, wherein the PLD comprises a plurality of programmable digital resources, and the delay line phase and frequency detector, the filter and control circuit, the dither circuit, and the DCO are all implemented using the programmable digital resources.

8. The CDR circuit of claim 6, wherein the PLD is a Field Programmable Gate Array (FGPA).

9. The CDR circuit of claim 8, wherein the delay line phase and frequency detector comprises a delay line implemented using a carry chain of the FPGA.

10. The CDR circuit of claim 1, wherein the data stream comprises 8 B/10 B encoded data in an NRZ format.

11. A system, comprising:
    a first device having a serial data output terminal, the serial data output terminal being coupled to provide a data stream that includes an encoded transmit clock signal; and
    a second device having a serial data input terminal coupled to the serial data output terminal of the first device, the second device further comprising:
    a delay line phase and frequency detector having a first input terminal coupled to the serial data input terminal, a DCO clock input terminal, and a plurality of output terminals;
    a filter and control circuit having a plurality of input terminals coupled to the plurality of output terminals of the delay line phase and frequency detector, a DCO clock input terminal, and an output terminal;
    a dither circuit having an input terminal coupled to the output terminal of the filter and control circuit, a DCO clock input terminal, and an output terminal; and
    a digitally controlled oscillator (DCO) having an input terminal coupled to the output terminal of the dither circuit, and further having an output terminal coupled to the DCO clock input terminal of the delay line phase and frequency detector, the DCO clock input terminal of the filter and control circuit, and the DCO clock input terminal of the dither circuit.

12. The system of claim 11, wherein the delay line phase and frequency detector comprises:
    a delay line having an input terminal coupled to the serial data input terminal, and further having a plurality of tap output terminals comprising a series of taps from the delay line;
    a register having a plurality of data input terminals coupled to the tap output terminals of the delay line, a clock terminal coupled to the DCO clock input terminal of the delay line phase and frequency detector, and a plurality of data output terminals; and
    a phase and frequency detector having a plurality of input terminals coupled to the data output terminals of the register, a DCO clock input terminal coupled to the DCO clock input terminal of the delay line phase and frequency detector, and a plurality of output terminals coupled to the plurality of output terminals of the delay line phase and frequency detector.

13. The system of claim 12, wherein the register comprises two flip-flops coupled in series between each data input terminal and a corresponding data output terminal, each flip-flop having a clock input terminal coupled to the DCO clock input terminal of the delay line phase and frequency detector.

14. The CDR circuit of claim 13, wherein the register further comprises a data output flip-flop having a clock input terminal coupled through an inverter to the DCO clock input terminal of the delay line phase and frequency detector, the data output flip-flop providing data extracted from the center of the delay line.

15. The system of claim 12, wherein:
    the plurality of tap output terminals of the delay line comprises 64 tap output terminals; and
    the plurality of data output terminals of the register comprises 64 data output terminals.

16. The system of claim 11, wherein the second device is a programmable logic device (PLD).

17. The system of claim 16, wherein the PLD comprises a plurality of programmable digital resources, and the delay line phase and frequency detector, the filter and control circuit, the dither circuit, and the DCO are all implemented using the programmable digital resources.

18. The system of claim 16, wherein the PLD is a Field Programmable Gate Array (FGPA).

19. The system of claim 18, wherein the delay line phase and frequency detector comprises a delay line implemented using a carry chain of the FPGA.

20. The system of claim 11, wherein the data stream comprises 8 B/10 B encoded data in an NRZ format.

* * * * *